(12) United States Patent
Kang et al.

(10) Patent No.: US 12,733,497 B2
(45) Date of Patent: Sep. 8, 2026

(54) METHOD OF DIRECT COOLING USING A CONDUCTIVE STRIP

(71) Applicant: SEMICONDUCTOR COMPONENTS INDUSTRIES, LLC, Scottsdale, AZ (US)

(72) Inventors: Ingoo Kang, Gwangsan-gu (KR); Oseob Jeon, Seoul (KR); Seungwon Im, Bucheon (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 487 days.

(21) Appl. No.: 18/324,362

(22) Filed: May 26, 2023

(65) Prior Publication Data

US 2024/0395662 A1 Nov. 28, 2024

(51) Int. Cl.

| | |
|---|---|
| ***H10W 40/47*** | (2026.01) |
| ***H10W 70/05*** | (2026.01) |
| ***H10W 72/50*** | (2026.01) |
| ***H10W 90/00*** | (2026.01) |

(52) U.S. Cl.

CPC ........... *H10W 40/47* (2026.01); *H10W 70/05* (2026.01); *H10W 90/00* (2026.01); *H10W 72/5524* (2026.01); *H10W 90/753* (2026.01); *H10W 90/754* (2026.01)

(58) Field of Classification Search

CPC .................. H01L 23/367–3677; H01L 23/473

See application file for complete search history.

(56) References Cited

U.S. PATENT DOCUMENTS

| | | | | |
|---|---|---|---|---|
| 4,964,458 A * | 10/1990 | Flint | H01L 23/467 | 257/722 |
| 6,351,384 B1 * | 2/2002 | Daikoku | F28F 3/02 | 361/689 |
| 7,755,185 B2 * | 7/2010 | Bayerer | H01L 23/473 | 257/714 |
| 9,275,926 B2 | 3/2016 | Hable et al. | | |
| 9,585,241 B2 | 2/2017 | Hable et al. | | |
| 11,032,944 B2 | 6/2021 | Gwin | | |
| 2002/0017714 A1 * | 2/2002 | Choi | H01L 23/49562 | 257/E23.125 |

(Continued)

FOREIGN PATENT DOCUMENTS

| | | | |
|---|---|---|---|
| CN | 114270503 A * | 4/2022 | H05K 7/20 |
| DE | 102007004005 A1 * | 10/2007 | H01L 23/4334 |

(Continued)

OTHER PUBLICATIONS

International Search Report and Written Opinion for PCT Application No. PCT/US2024/031012, mailed on Oct. 1, 2024, 11 pages.

*Primary Examiner* — Evren Seven

(74) *Attorney, Agent, or Firm* — Brake Hughes Bellermann LLP

(57) ABSTRACT

A package includes a semiconductor die disposed on a three-layer substrate. The three-layer substrate includes a ceramic layer disposed between a top metal layer and a bottom metal layer. The semiconductor die is disposed on the top metal layer. An array of mesas is defined in the bottom metal layer with grooves between the mesas forming a path for cooling fluid flow across a surface of the bottom metal layer.

22 Claims, 10 Drawing Sheets

(56) References Cited

U.S. PATENT DOCUMENTS

| | | | | |
|---|---|---|---|---|
| 2003/0186483 | A1* | 10/2003 | Choi | H01L 24/97 257/E23.125 |
| 2009/0174063 | A1* | 7/2009 | Furukawa | H01L 23/3735 257/703 |
| 2010/0002397 | A1* | 1/2010 | Toh | H01L 23/4006 361/713 |
| 2011/0024086 | A1* | 2/2011 | Tan | H01L 23/427 29/890.032 |
| 2013/0062750 | A1* | 3/2013 | Lenniger | H01L 24/48 257/691 |
| 2013/0285234 | A1 | 10/2013 | Uhlemann et al. | |
| 2014/0327127 | A1* | 11/2014 | Hable | H01L 23/473 438/122 |
| 2015/0085446 | A1 | 3/2015 | Hable et al. | |
| 2016/0111345 | A1* | 4/2016 | Kawase | H01L 23/3675 257/706 |
| 2016/0293518 | A1* | 10/2016 | Gohara | H01L 23/473 |
| 2017/0245394 | A1* | 8/2017 | Matte | F28F 3/06 |
| 2017/0278770 | A1* | 9/2017 | Kato | H01L 23/473 |

FOREIGN PATENT DOCUMENTS

| | | | | | |
|---|---|---|---|---|---|
| DE | 112013007047 | B4 | * | 2/2023 | H01L 23/49844 |
| EP | 2844051 | A2 | * | 3/2015 | H01L 21/4882 |
| EP | 2840604 | B1 | * | 7/2017 | F28F 9/00 |
| EP | 4071802 | B1 | * | 5/2024 | H10D 30/60 |
| ES | 2611228 | T3 | * | 5/2017 | H01L 23/473 |
| WO | WO-2008075409 | A1 | * | 6/2008 | H01L 23/3735 |
| WO | WO-2013111234 | A1 | * | 8/2013 | H01L 25/162 |
| WO | WO-2015033724 | A1 | * | 3/2015 | H01L 23/562 |
| WO | WO-2015037047 | A1 | * | 3/2015 | H01L 25/112 |

* cited by examiner

T3
d
11
12
100-1
100-2
100-3
100
S
T
x
y
z
50

METHOD OF DIRECT COOLING USING A CONDUCTIVE STRIP

TECHNICAL FIELD

This disclosure relates to cooling systems for power electronics assemblies.

BACKGROUND

Effective thermal management of power electronics assemblies, modules, or packages is needed for increasing power density and improving reliability in many applications (e.g., in electric drive vehicles). For example, electric and hybrid electric vehicles utilize high voltage battery packs or fuel cells that deliver high power direct current to drive vehicle motors, electric traction systems and other vehicle systems. In addition, these vehicles can include power electronics assemblies (e.g., inverters) to convert the direct current provided by, for example, the battery packs, to alternating current for use by electric motors and other electric devices and systems of the vehicle. A power electronics assembly can include heat-generating semiconductor devices such an insulated-gate bipolar transistor (IGBT) and a fast recovery diode (FRD). Compact packaging of power electronics assemblies creates thermal management challenges that need to be addressed for power-dense systems.

SUMMARY

In a general aspect, a package includes a semiconductor die disposed on a three-layer substrate. The three-layer substrate includes a ceramic layer disposed between a top metal layer and a bottom metal layer. The semiconductor die is disposed on the top metal layer. An array of mesas is defined in the bottom metal layer with grooves between the mesas forming a path for cooling fluid flow across a surface of the bottom metal layer.

In a general aspect, a method includes forming a set of mesas in a bottom metal layer of a three-layer direct bonded metal (DBM) substrate to increase a surface area of the bottom metal layer. The method further includes disposing a semiconductor die on a top metal layer of the three-layer DBM substrate, and exposing the bottom metal layer of the three-layer DBM substrate through a bottom of a mold body encapsulating the semiconductor die.

In a general aspect, a direct bonded metal (DBM) substrate includes a ceramic tile, a top metal layer bonded to one side of the ceramic tile, and a bottom metal layer bonded to an opposite side of the ceramic tile. The bottom metal layer includes a set of mesas in a surface.

In an aspect, the bottom metal layer of the DBM substrate includes an array of mesas with a plurality of mesas arranged in a row in the bottom metal layer. The mesas in the row have a length and a width in a cross section, and a top surface at a height h. The DBM substrate further includes a corrugated conductive strip including coupling portions and bridging portions attached to the top surfaces the mesas in the row.

Figure 1:
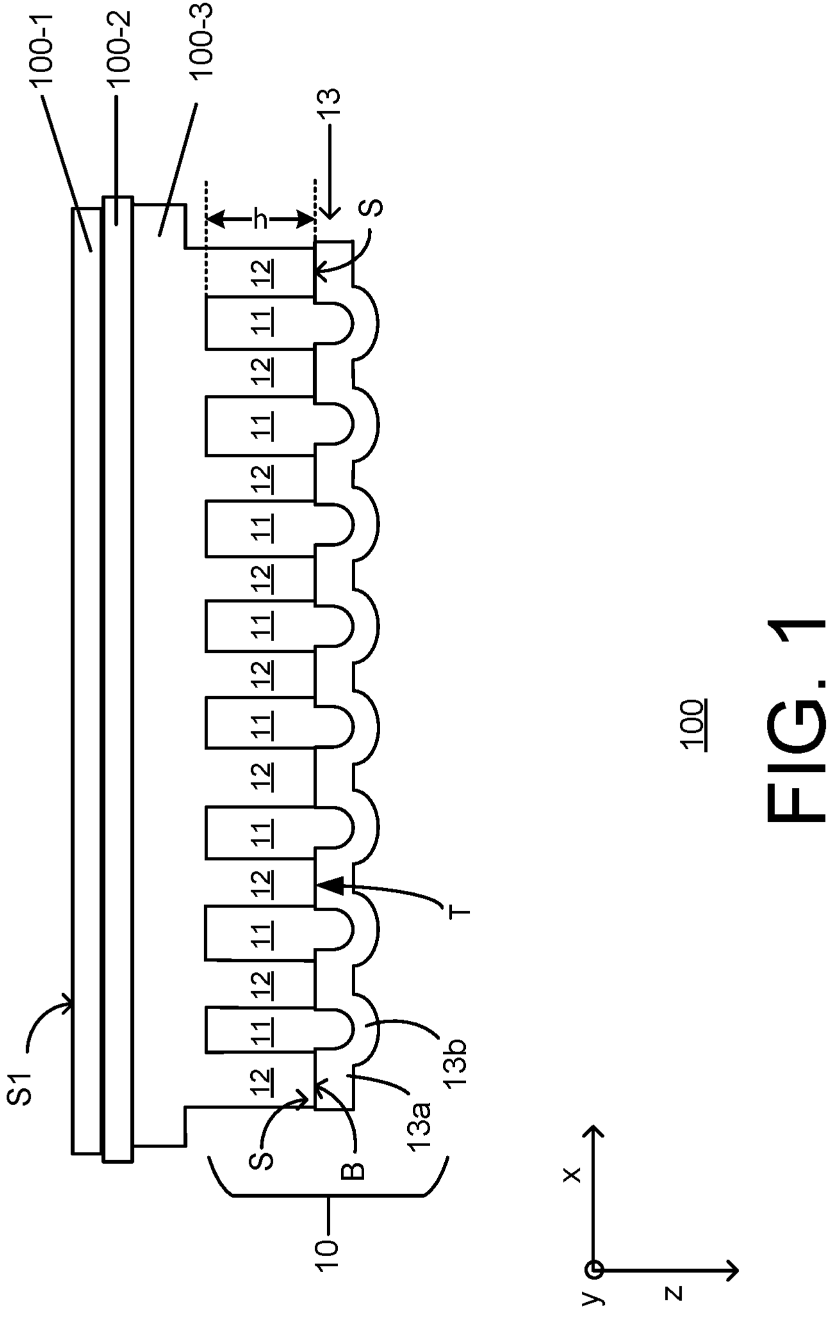
FIG. 1 schematically illustrates, in a cross-sectional view, of a three-layer substrate with a bottom layer including mesas, in accordance with the principles of the present disclosure.

In the drawings, which are not necessarily drawn to scale, like reference symbols and or alphanumeric identifiers may indicate like and/or similar components (elements, structures, etc.) in different views. The drawings illustrate, by way of example, but not by way of limitation, various implementations discussed in the present disclosure. Reference symbols and or alphanumeric identifiers shown in one drawing may not be repeated for the same, and/or similar elements in related views in other drawings. Reference symbols and or alphanumeric identifiers that are repeated in multiple drawings may not be specifically discussed with respect to each of those drawings but are provided for convenience in cross reference between related views. Also, not all like elements in the drawings are specifically referenced with a reference symbol and or an alphanumeric identifier when multiple instances of an element are illustrated.

DETAILED DESCRIPTION

The present disclosure is directed a heat management system for a power electronics module. The power electronics module (or sub-package) may, for example, include power electronic devices (e.g., silicon-controlled rectifiers (SCRs), insulated-gate bipolar transistors (IGBTs), field effect transistors (FETs), etc.) to provide AC power to loads. The power electronic devices can be silicon based or based on wide band gap (WBG) semiconductors. The power electronic devices can generate heat which can be removed to keep the devices at acceptable operating temperatures. For high power density applications (e.g., power density at or greater than 240 kW) the demands for efficient heat removal can be severe. The implementations described herein can facilitate efficient heat removal.

In example implementations, the power electronics module may include at least a semiconductor die (e.g., an IGBT and/or an FRD). The semiconductor die may be mounted on a top surface (e.g., outer surface) of substrate (e.g., a printed circuit board, a direct bonded metal (DBM) substrate, a direct bonded copper (DBC) substrate, etc.). The semiconductor die or dies may be packaged (e.g., encapsulated in a molding compound), for example, as a single side direct cooled (SSDC) power electronics module with signal pins and power terminals extending from the module. The power electronics module may have a width and a length along a surface of the substrate, and a thickness perpendicular (generally perpendicular) to the substrate (in the direction of the semiconductor die mounted on the top surface of substrate). In example implementations, for an IGBT power electronics module, the length and width may be measured in centimeters, while the thickness may be in the range of a few millimeters or less.

In a SSDC package, heat generated by the semiconductor die or dies flows perpendicularly through the substrate for dissipation from a bottom surface of the substrate. In some instances, a heat sink (e.g., a baseplate, or a baseplate with fins) may be attached to the bottom surface of the substrate to aid in dispersal of the heat generated in the power electronics module. The baseplate with fins may include pin fins (i.e., fins shaped like pins). The power electronics module may be further configured with either forced air and liquid cooled options to remove the heat generated in the power electronics module.

In example implementations, the semiconductor die may be mounted on a three-layer substrate (e.g., a direct bonded metal (DBM) substrate). The DBM substrate may include a thermally conductive but electrically insulating layer (e.g., a ceramic tile or plate) sandwiched between a top layer and a bottom layer. The top layer and the bottom layer may be made of metal of metal alloys. The semiconductor die may be mounted on the top metal layer of the substrate. The bottom metal layer of the substrate may also be the bottom surface of the molded body of the package and be exposed to an outside of the molded body of the package for heat dissipation. Heat dissipation through the exposed bottom surface can occur by radiation and or by heat transfer to a cooling fluid (e.g., air, water, water glycol mixture, etc.) that may be in contact with the exposed bottom surface. In example implementations, a cooling jacket may be attached to or included in the package to flow the cooling fluid across the exposed bottom surface. The cooling fluid may transport heat away from the exposed bottom surface. Under the various mechanisms of heat transfer (e.g., conduction or convection through a cooling fluid) the amount and rate of heat transfer from the exposed bottom surface can be proportional to the surface area of the bottom surface in contact with the cooling fluid. A greater surface area of the exposed bottom surface can result in a larger amount of heat transfer than the amount of heat that would be transferred from a smaller surface area.

In example implementations, a surface (e.g., a bottom metal layer) of a substrate has mesas (e.g., fins) to increase the surface area available for heat transfer from a semiconductor die mounted on a front side of the substrate, in accordance with the principles of the present disclosure.

In example implementations, the mesas on the surface (e.g., bottom metal layer) of the substrate may include parallel grooves and mesas (e.g., protrusions, fins) (when viewed from above) disposed on the surface. The parallel grooves may be disposed between or defined between the mesas.

In some example implementations, a set of parallel grooves extending in a direction (e.g., x direction) may be intersected by another set of parallel grooves extending in another direction (e.g., a y direction) on the surface. The ridges formed between the sets of parallel grooves may be arranged or patterned as an array of mesas. The mesas may, for example, have a cross section (when viewed from above) of a square, a rectangular, a trapezoidal, or another shape, and a vertical height h (in the z-direction).

In example implementations, the mesas on the surface (e.g., bottom metal layer) of the substrate may further include a conductive strip bonded to the surface (top surfaces of the mesas).

The conductive strip may have a corrugated shape including portions that are coupling portions (e.g., flat portions) and bridging portions (e.g., curved portions) that, for example, together define a wavy-type shape. The conductive strip may be bonded to the tops of the ridges (mesas) formed on the surface. In example implementations, the corrugation of the conductive strip may include alternating grooves and ridges (when viewed from the side). In some implementations, the corrugation of the conductive strip can include a series of concave portions, a series of convex portions, or a series of alternating concave and convex portions.

FIG. 1 shows a cross sectional view of a three-layer substrate 100 with a bottom layer including mesas, in accordance with the principles of the present disclosure.

Three-layer substrate 100 (e.g., a DBM substrate) may, for example, include a thermally conductive but electrically insulating ceramic plate or tile (e.g., layer 100-2) disposed between a top metal layer (e.g., layer 100-1) and a bottom metal layer (e.g., layer 100-3). Top metal layer (e.g., layer 100-1) may have a flat surface S1 and include one or more die attach pads (not shown) on which semiconductor dies can be mounted. In example implementations, layer 100-3 includes a set of mesas 10. In example implementations, set of mesas 10 may be formed by parallel grooves (groove 11) and protrusions or mesas (e.g., mesa 12) formed in a bottom surface (surface S) of layer 100-3. The parallel grooves and ridges may alternate, for example, in the x direction. In example implementations, a set of parallel grooves extending in a direction (e.g., x direction) on the surface S may be intersected by another set of parallel grooves extending in another direction (e.g., a y direction, FIG. 5A) on the surface S. The mesas 12 (e.g., protrusions) formed between the sets of the intersecting parallel grooves may form a pattern or an array of mesas. The mesas 12 may, for example, have a cross section (in the x-y plane) of a square, a rectangular, a trapezoidal, or another shape. Further, the mesas 12 may, for example, have a vertical height h (in the z-direction). The mesas with a height h may have a top surface T (also can be referred to as an outer surface).

Further, a conductive strip 13 is bonded to the top surfaces T of the mesas (e.g., mesa 12). Conductive strip 13 may, for example, be a corrugated strip including coupling portions (e.g., coupling portion 13*a*) and bridging portions (e.g., bridging portion 13*b*). The coupling portions (e.g., coupling portion 13*a*) may be aligned with and bonded to the top surface T of the mesas (e.g., mesa 12). The bridging portions 13*b* may have a curved shape or wavy shape (e.g., a half-cylinder shape) extending over groove 11 between adjacent coupling portions 13*a*. In some implementations, the coupling portions 13*a* can, in some implementations, have a flat shape. In some implementations, the coupling portions 13*a* can have a flat surface (e.g., flat bottom surface B) so that they can be coupled to the top surfaces T of the mesas 12, which are flat.

In this implementation, the bridging portions 13*b* have a convex shape that protrudes in a direction away from the shape (or bottom surface) of the groove 11. In other words, the bridging portions 13*b* have a convex shape that protrudes in a same direction as the mesas 12 (e.g., protrudes away from the mesas). This results in a larger cavity defined by the groove 11 and the bridging portions 13*b* than if the conductive strip 13 were flat. Although not shown, in some implementations, the bridging portions 13*b* may not have a convex shape that protrudes in a direction away from the shape of the groove 11.

Layer 100-3 including set of mesas 10 may present a larger surface area to cooling fluids flowing across layer 100-3 than a flat planar layer (e.g., layer 100-3 without set of mesas 10).

Figure 2:
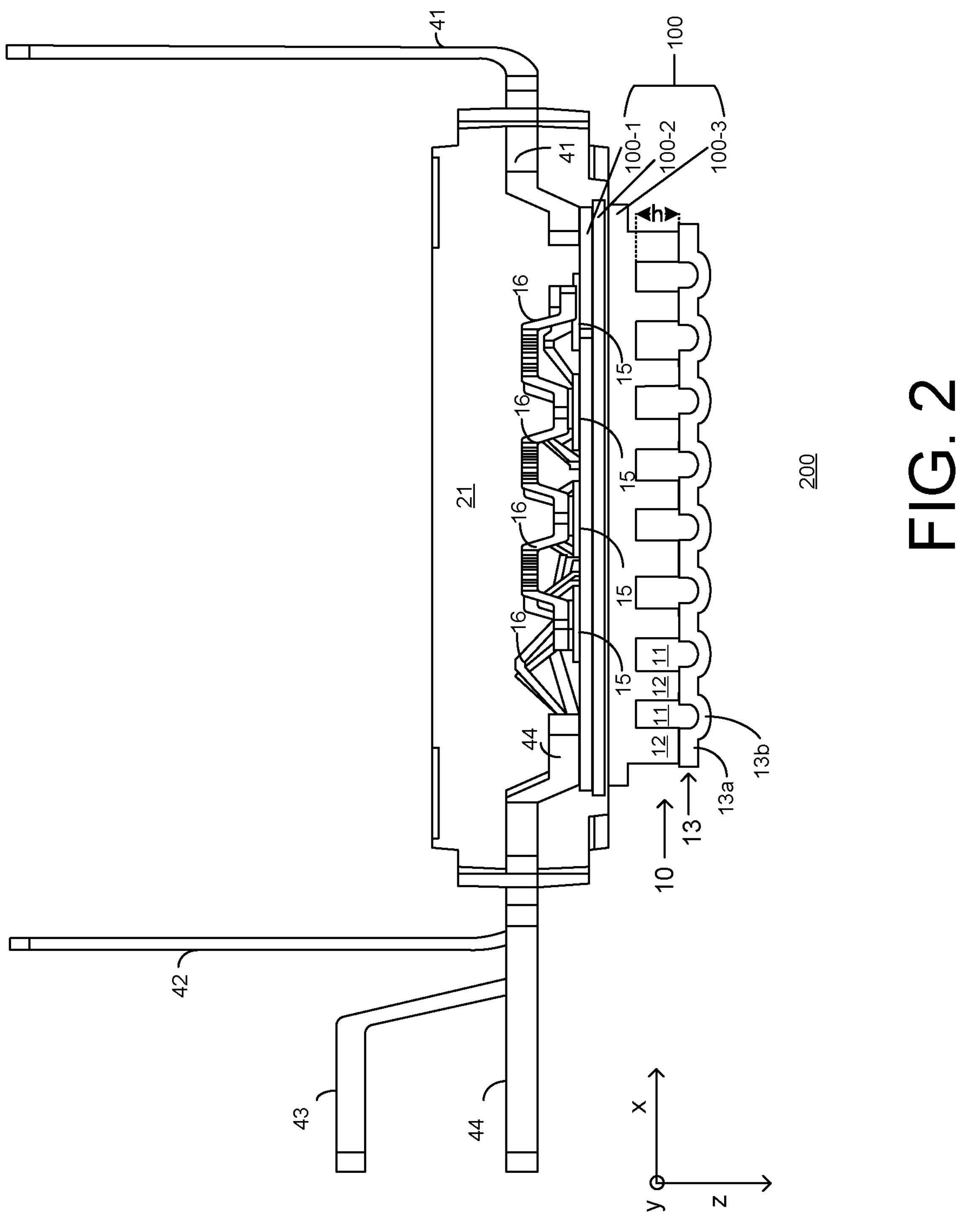
FIG. 2 schematically illustrates, in a cross-sectional view of an example semiconductor device package in which semiconductor die are disposed on the three-layer substrate of FIG. 1, in accordance with the principles of the present disclosure.

FIG. 2 shows a cross-sectional view of an example semiconductor device package 200 in which semiconductor die are disposed the three-layer substrate 100 of FIG. 1, in accordance with the principles of the present disclosure.

In example semiconductor device package 200, layer 100-3 (including set of mesas 10) provides a heat dissipation path for heat generated by the semiconductor die in the package. As shown in FIG. 2, in example semiconductor device package 200, semiconductor die (e.g., semiconductor die 15) may be disposed on the top metal layer (e.g., layer 100-1) of the three-layer substrate 100. The semiconductor die may, for example, include an insulated-gate bipolar transistor (IGBT), fast recovery diode FRD, a silicon carbide power transistor, or any other type of device. The various die 15 may be interconnected to each other, for example, by wire bonds 16 (e.g., aluminum wire bonds). Wire bond 16 may also connect leads (e.g., lead 42, lead 43, lead 44) to the semiconductor die. A lead (e.g., lead 44) may be connected directly to layer 100-1 on which the semiconductor die are mounted.

In example semiconductor device package 200, the semiconductor dies (e.g., semiconductor die 15) and portions of the substrate (e.g., three-layer substrate 100) may be encapsulated in a mold body 21. A lead (e.g., lead 41, 42, 43, and 44) may extend outside the mold body and form external terminals of the package. The bottom metal layer (e.g., layer 100-3) of the substrate may also be the bottom surface of the mold body of the package and may be exposed to an outside of the mold body of the package for heat dissipation.

In example implementations, a cooling-fluid jacket may be attached to a bottom of the mold body of the package to direct a flow of a cooling fluid (e.g., water, a water-glycol mixture, etc.) across the set of mesas 10 of the bottom metal layer (e.g., layer 100-3) of the three-layer substrate 100.

Figure 3:
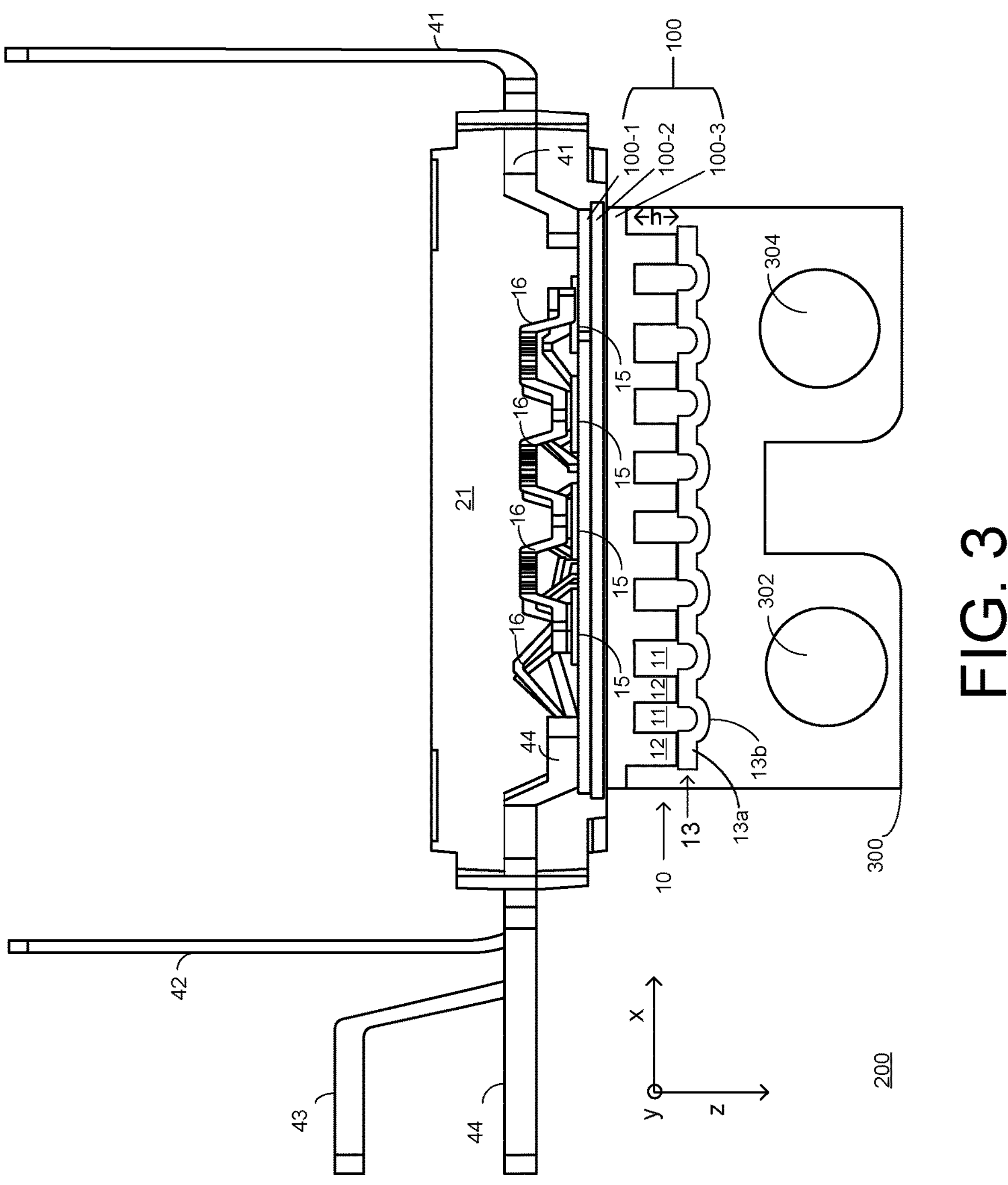
FIG. 3 schematically illustrates a cooling jacket attached to the bottom of the mold body of the semiconductor device package of FIG. 2.

FIG. 3 shows, for example, a cooling jacket 300 attached to the bottom of the mold body of semiconductor device package 200. Cooling jacket 300 may include an inlet port (port 302) through which the cooling fluid can enter the jacket and flow across surfaces of the set of mesas 10 to pick up heat. Cooling jacket 300 may further include an outlet port (port 304) through which the cooling fluid can exit the jacket after flowing cross surfaces of the set of mesas 10.

A stream of the cooling fluid (e.g., water, a water-glycol mixture, etc.) can enter the jacket through the inlet port, pass over, or through, the mesas (e.g., set of mesas 10) on the power electronics module placed along the cooling fluid channel in the jacket to remove heat generated by the power electronics module, and exit the jacket through the output port. The stream of the cooling fluid may be driven by a recirculating pump (not shown).

FIG. 4 through FIG. 6B show views of a double bonded metal (DBM) substrate (e.g., three-layer substrate 100) at different stages of construction of a set of mesas in surface layer on the DBM substrate.

Figure 4:
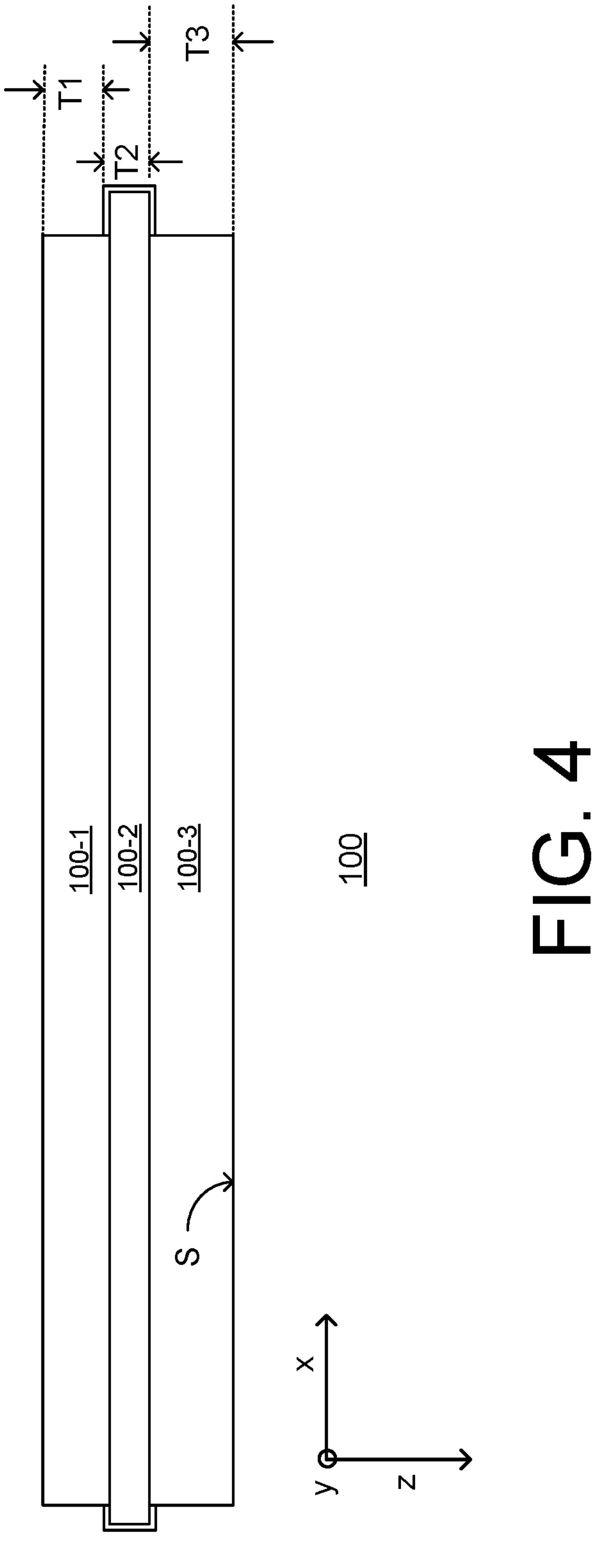
FIG. 4, FIG. 5A, FIG. 5B, FIG. 6A and FIG. 6B illustrate views of an example double bonded metal (DBM) substrate at different stages of construction of a surface layer having mesas on the DBM substrate.

FIG. 4 shows a starting DMB substrate (e.g., three-layer substrate 100), at a first stage of construction, before forming a set of mesas. DMB substrate may include a top metal layer (e.g., layer 100-1) and a bottom metal layer (e.g., layer 100-3) bonded on a top side and a bottom side, respectively, of a thermally conductive electrically insulating layer (e.g., layer 100-2). Layer 100-2 may be made of thermally conductive ceramic or epoxy materials. The top metal layer (e.g., layer 100-1) and the bottom metal layer (e.g., layer 100-3) may be made of metal or metallic alloys (e.g., copper). In example implementations, the top metal layer (e.g., layer 100-1) and the bottom metal layer (e.g., layer 100-3) may be plated copper layers.

Layer 100-1, layer 100-2, and layer 100-3 may have thicknesses T1, T2, and T3, respectively. In example implementations, for fabrication of a set of mesas (e.g., set of mesas 10) that are configured as a cooling mechanism in device packages (e.g., semiconductor device package 200), the thickness T3 of layer 100-3 in starting three-layer substrate 100 may be at least 1 mm.

Figure 5A:
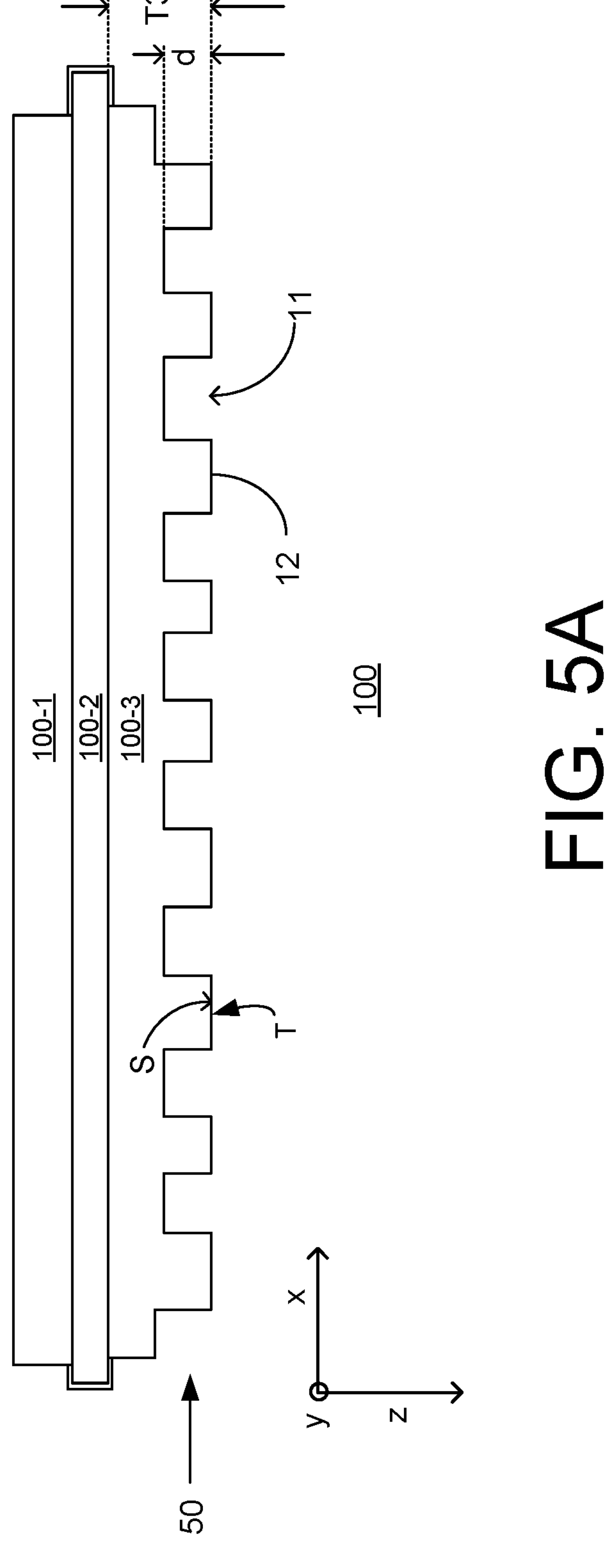
Figure 5B:
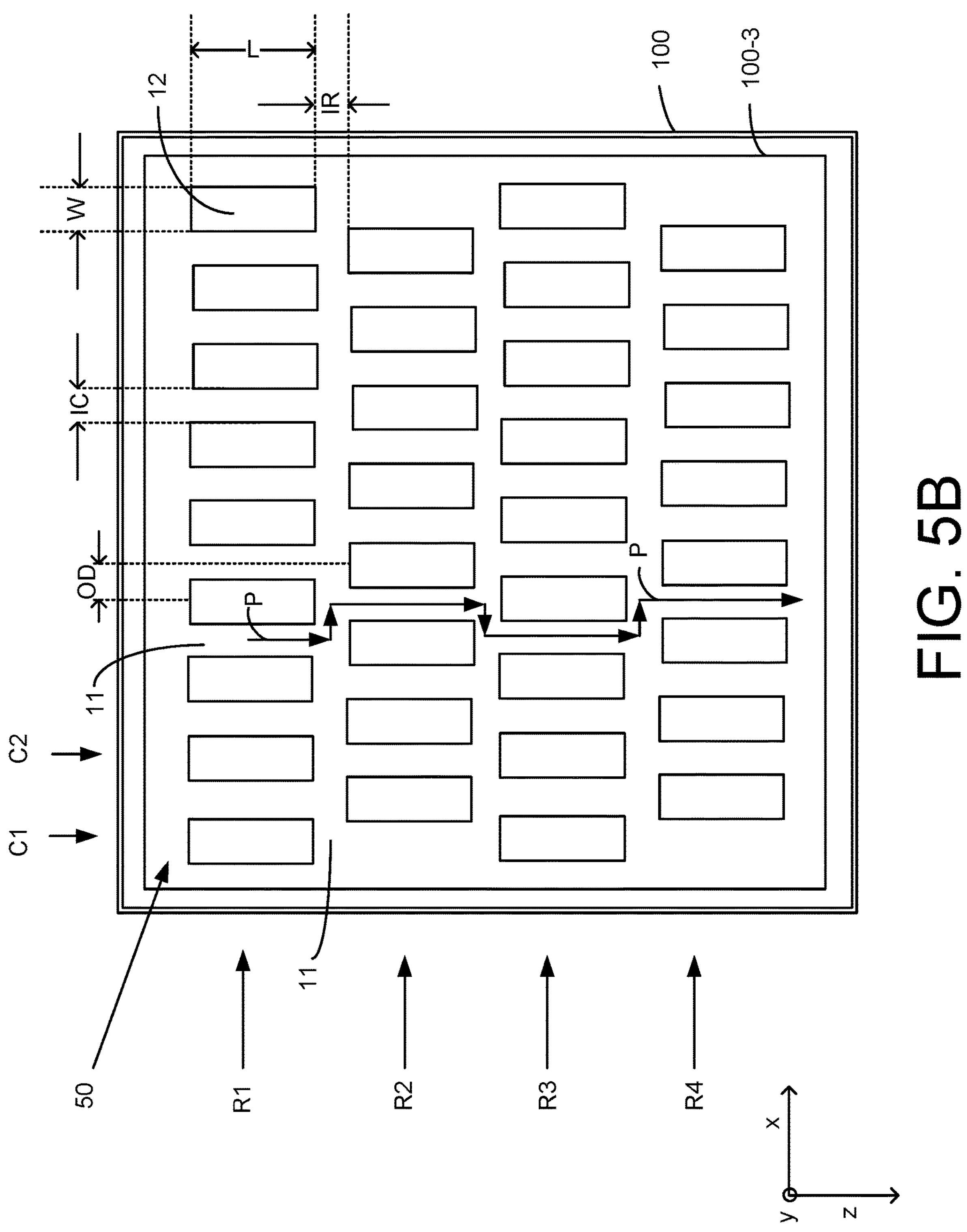

FIG. 5A shows a cross sectional view and FIG. 5B shows a plan view of three-layer substrate 100 after a second stage of construction.

At the second stage of construction, surface S of layer 100-3 is lithographically patterned and a set of grooves (e.g., groove 11) is etched in layer 100-3 to form a pattern of mesas (pillars) (e.g., pattern 50 of mesas 12).

As shown in FIG. 5A, the grooves (e.g., groove 11) may have a depth d (in the z direction) (in other words, the mesas may have a corresponding height h=h, FIG. 2). The mesas may have top surfaces (e.g., surface T) that may, for example, be the same as the original surface S of layer 100-3. In example implementations, the depth d of the grooves to which surface S of layer 100-3 is etched may be at least about one half the thickness T3 of layer 100-3 in starting three-layer substrate 100. For example, when the thickness T3 of layer 100-3 in starting three-layer substrate 100 is at least 1 mm, the depth d of the grooves may be at least about 0.5 mm (in other words, the mesas may have a corresponding height h of at least about 0.5 mm).

In example implementations, as shown in FIG. 5B, mesas (e.g., mesa 12) may have a cross section with a width W (in the x direction) and a length L (in the y direction). In example implementations, width W may be in range of 2.0 mm to 4.0 mm (e.g., about 1.3 mm) and length L may be in range of 2.0 mm to 4.0 mm (e.g., about 2.5 mm).

The pattern of the mesas (e.g., pattern 50) may include several mesas (e.g., mesa 12) arranged in rows (e.g., row R1, R2, R3, R4) (e.g., extending in a x direction), and columns (e.g., column C1, C2, etc.) (e.g., extending in a y direction).

Mesas in adjacent rows (e.g., row R1 and R2) may be separated by an inter-row distance (e.g., distance IR) (e.g., the distance between columns R1 and R2).

Further, adjacent mesas in a specific row (e.g., row R1) may be separated by an inter-columnar distance (e.g., distance IC) (e.g., the distance between columns C1 and C2). Mesas 12 in the specific row (e.g., row R1) may be disposed in a linear array with a pitch equal to the sum of the mesa width W and the inter columnar distance IC.

The inter-row distance (e.g., distance IR) and the inter-columnar distance (e.g., distance IC) may correspond to a width of the grooves (groove 11) that define the mesas. In example implementations, the inter-row distance (e.g., distance IR) may, for example, be between 1.0 mm and 3.0 mm (e.g., about 1.2 mm) and the inter-columnar distance (e.g., distance IC) may, for example, be between 1.0 mm and 3.0 mm (e.g., about 1.2 mm).

The grooves (e.g., groove 11) which define the mesas (e.g., mesa 12) in pattern 50 may create a path P (e.g., a serpentine path, zig-zag path) for cooling fluid flow along sides of the mesas in pattern 50. In example implementations, the mesas in a row (e.g., row R1) may be offset from corresponding mesas in the next row (e.g., row R2) by an offset distance (e.g., distance OD) (e.g., in the x direction). In example implementations, the offset distance (e.g., distance OD) for example, be between 1.0 mm and 3.0 mm (e.g., about 1.3 mm). This offset of the mesas in a row and the next row may result, as shown in FIG. 5B, in creation of a zig-zag path (e.g., path P) around the sides of mesas across pattern 50 for cooling fluid flow.

Figure 6A:
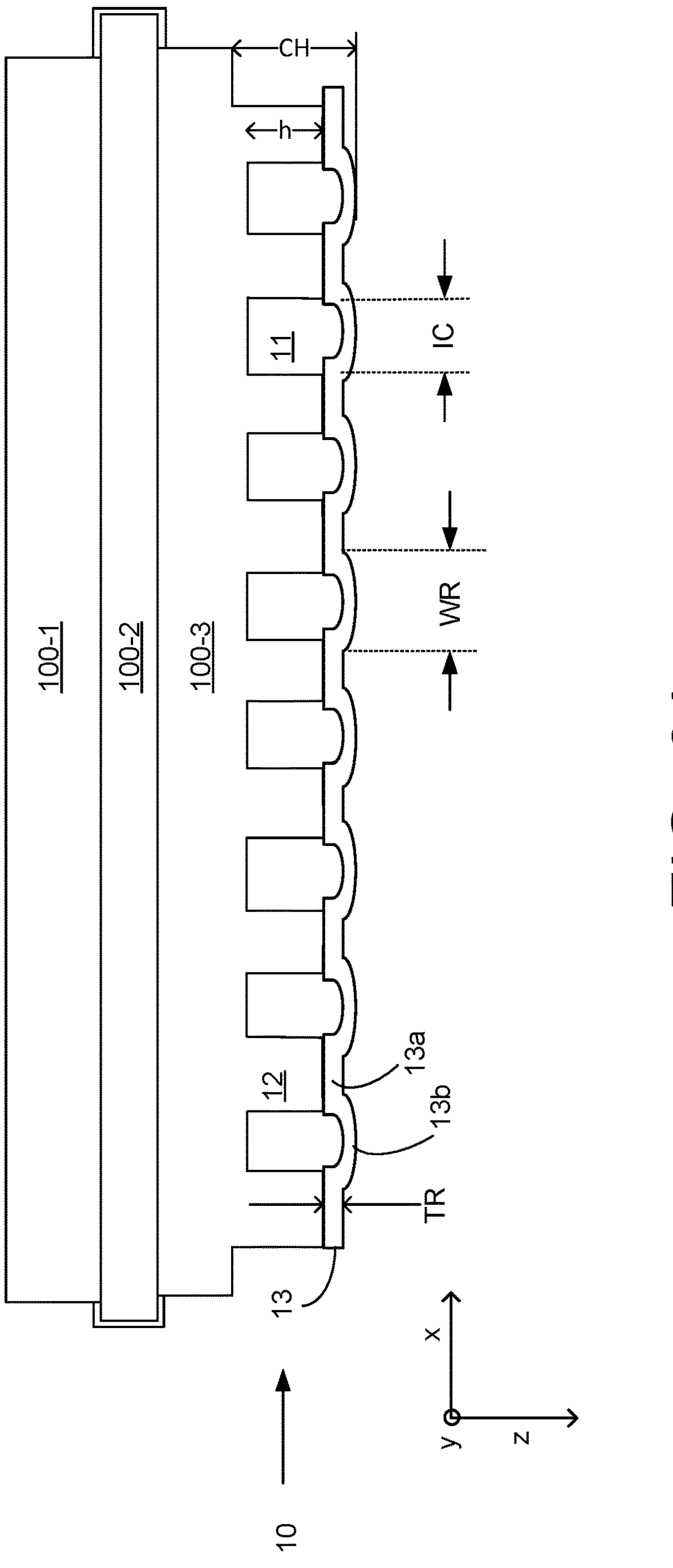
Figure 6B:
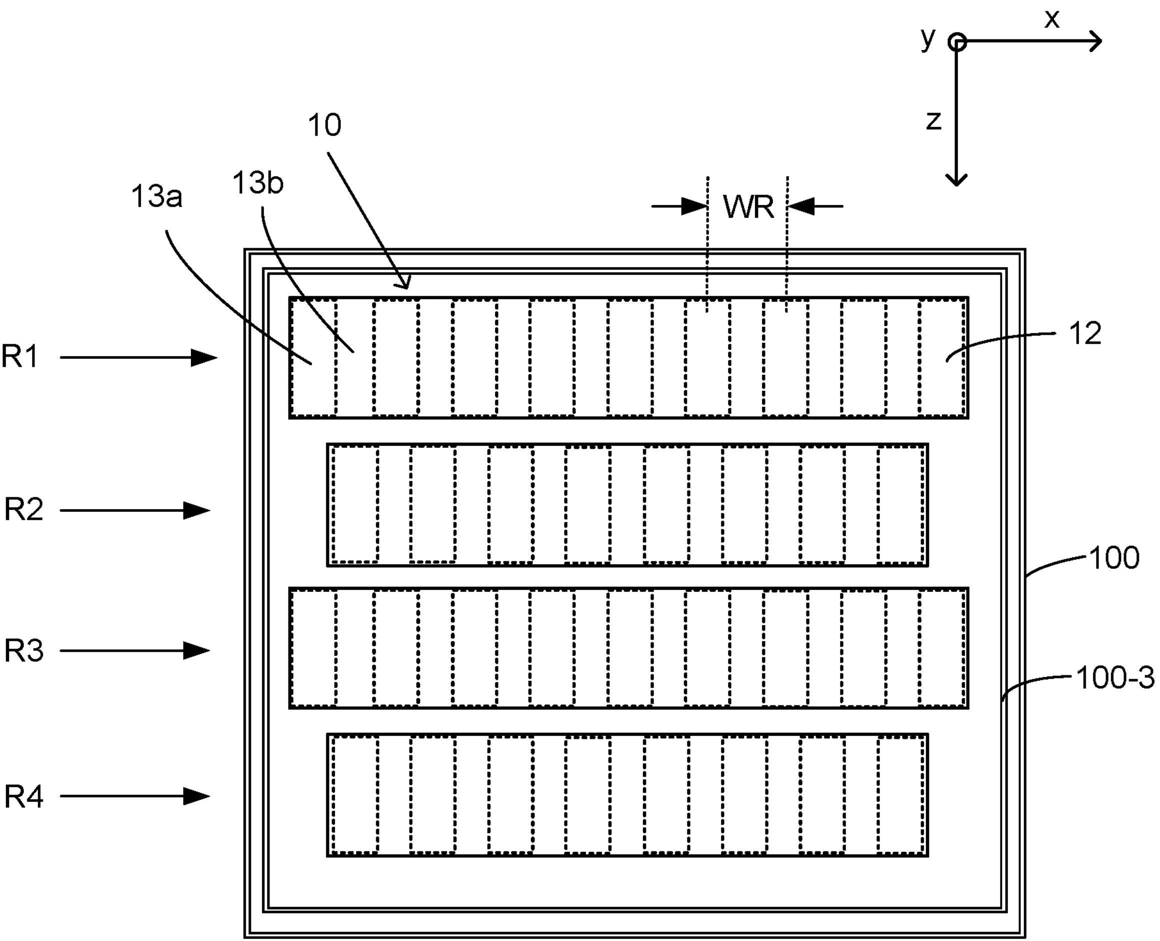

FIG. 6A shows a cross sectional view and FIG. 6B shows a plan view of three-layer substrate 100 after a third stage of construction. Because FIG. 6B is a plan view, bridging portions (e.g., bridging portion 13*b*) and coupling portions (e.g., coupling portions 13*b*) may not be readily seen, but are identified with labels.

At the third stage of construction, a conductive strip (e.g., conductive strip 13) is bonded to the top surfaces of the mesas formed in the rows (e.g., row R1, R2, R3, or R4) in layer 100-3. A separate conductive strip 13 may be used for each row. The separate conductive strip may have a width that is the same as, or about the same as the length L (in the y direction, FIG. 5B) of the mesa. In example implementations, the conductive strip may be a strip made of aluminum. As shown in FIG. 6A, conductive strip 13 may include coupling portions (e.g., coupling portion 13*a*) and bridging portions (e.g., bridging portion 13*b*). The coupling portions (e.g., coupling portion 13*a*) may be aligned with and bonded to the top surface T of the mesas (e.g., mesa 12) in a row (e.g., row R1, R2, R3, or R4). The bridging portions 13*b* of conductive strip 13 between two coupling portions (e.g., coupling portion 13*a*) may extend over groove 11 and form a bridge between pairs of the mesas. The bridging portions 13*b* may have a wavy shape (e.g., a half-cylinder shape) extending over groove 11 between adjacent coupling portions 13*a*. As shown in in FIG. 6A, conductive strip 13 may have a thickness TR in a range of about 0.1 mm to 0.4 mm (e.g., 0.2 mm). The bridging portions 13*b* of the attached conductive strip (e.g., conductive strip 13) may result in a set of mesas 10 that has a mesa height CH (in the y direction) that is greater than the heigh h of the mesa 12. In example implementations, the mesa height CH may be at least 1.0 mm.

Further, as shown in FIG. 6A and FIG. 6B, conductive strip 13 may have a width WR for each pair of mesas 12 bridged by conductive strip 13. In example implementations, width WR may be the same as a pitch (e.g., ~IC+W) of the mesas in a row (e.g., row R1, FIG. 5B). In example implementations, the conductive strip width WR (for each pair of mesas bridged) may be at least 2.0 mm.

After set of mesas 10 is formed on three-layer substrate 100, the substrate may be used for fabricating a semiconductor device package (e.g., semiconductor device package 200, FIG. 2). In the semiconductor device package, semiconductor die (e.g., semiconductor die 15) may be disposed on layer 100-1 of three-layer substrate 100, interconnected with wire bonds, and connected to leads (e.g., leads 41, 42, 43, and 44) before encapsulation in a mold body 21 (e.g., as shown in FIG. 2).

Figure 7:
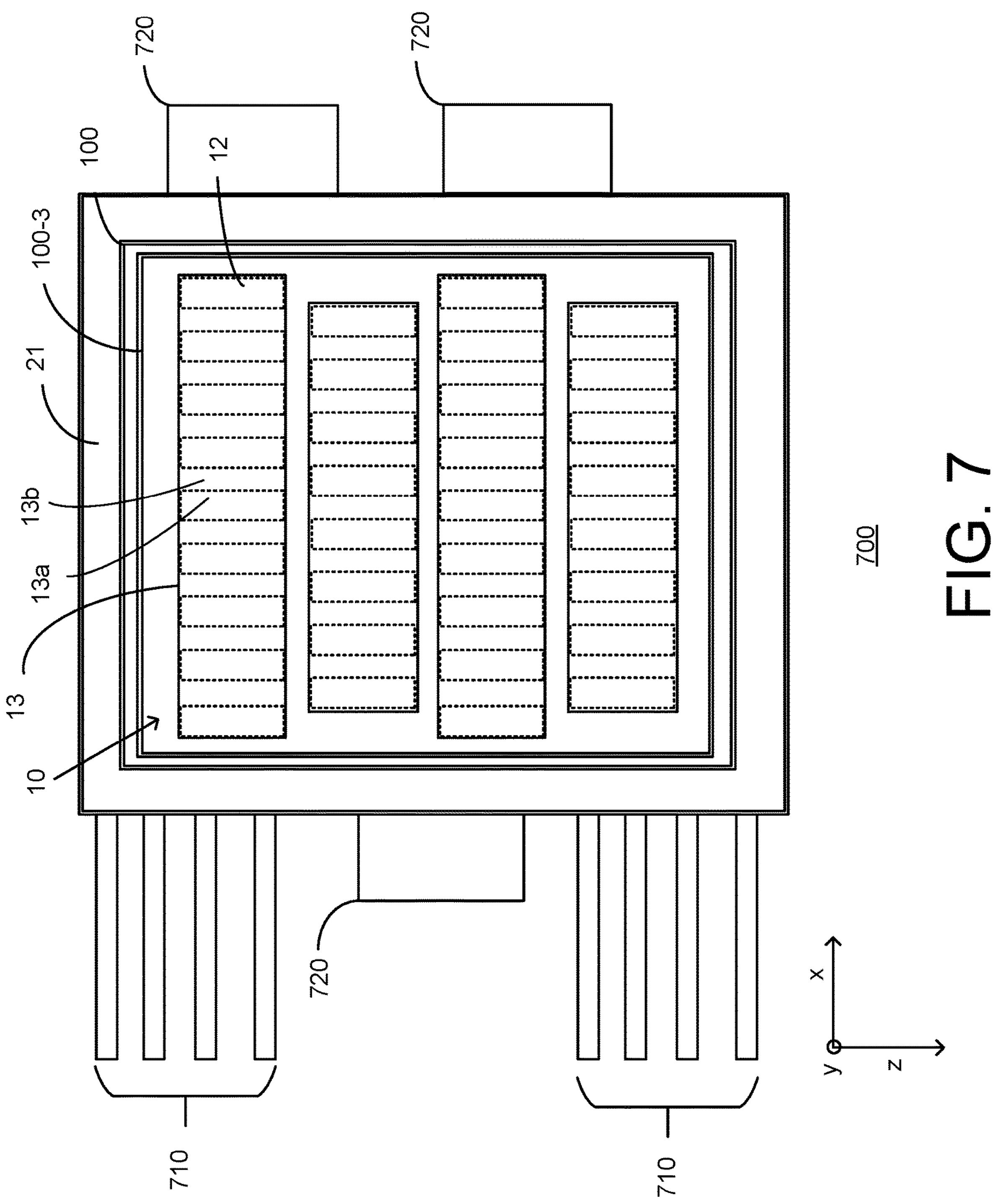
FIG. 7 illustrates a backside plan view of an example semiconductor device package fabricated on the substrate of FIG. 6A and FIG. 6B.

FIG. 7 shows a backside plan view of a semiconductor device package 700 fabricated on three-layer substrate 100 of FIG. 6A and FIG. 6B (before a cooling jacket e.g., cooling jacket 300 (FIG. 3) is attached to semiconductor device package 700). Semiconductor device package 700 may include semiconductor die (e.g., semiconductor die 15) disposed on a front side (top side) of three-layer substrate 100 (not visible in FIG. 7). The semiconductor die may be encapsulated in mold body 21, and external input/output signal leads (e.g., leads 710) connected to the semiconductor die may extend outside mold body 21. Mold body 21 may be attached to connector tabs (e.g., connector tabs 720) that may be used, for example, to mount semiconductor device package 700 in a chassis or frame (e.g., of an automotive application).

In example implementations, as shown in FIG. 7, the bottom layer (i.e., layer 100-3) of three-layer substrate 100 is exposed through the bottom of mold body 21. FIG. 7 shows elements (e.g., conductive strip 13 and mesas 12) of set of mesas 10 in layer 100-3 that may be exposed to cooling fluids (air, water, water-glycol mixture, etc.) to remove heat generated by the semiconductor die in semiconductor device package 700. A cooling jacket may be attached to semiconductor device package 700 to flow cooling fluids across set of mesas 10. For visual clarity, this cooling jacket is not shown in FIG. 7.

Figure 8:
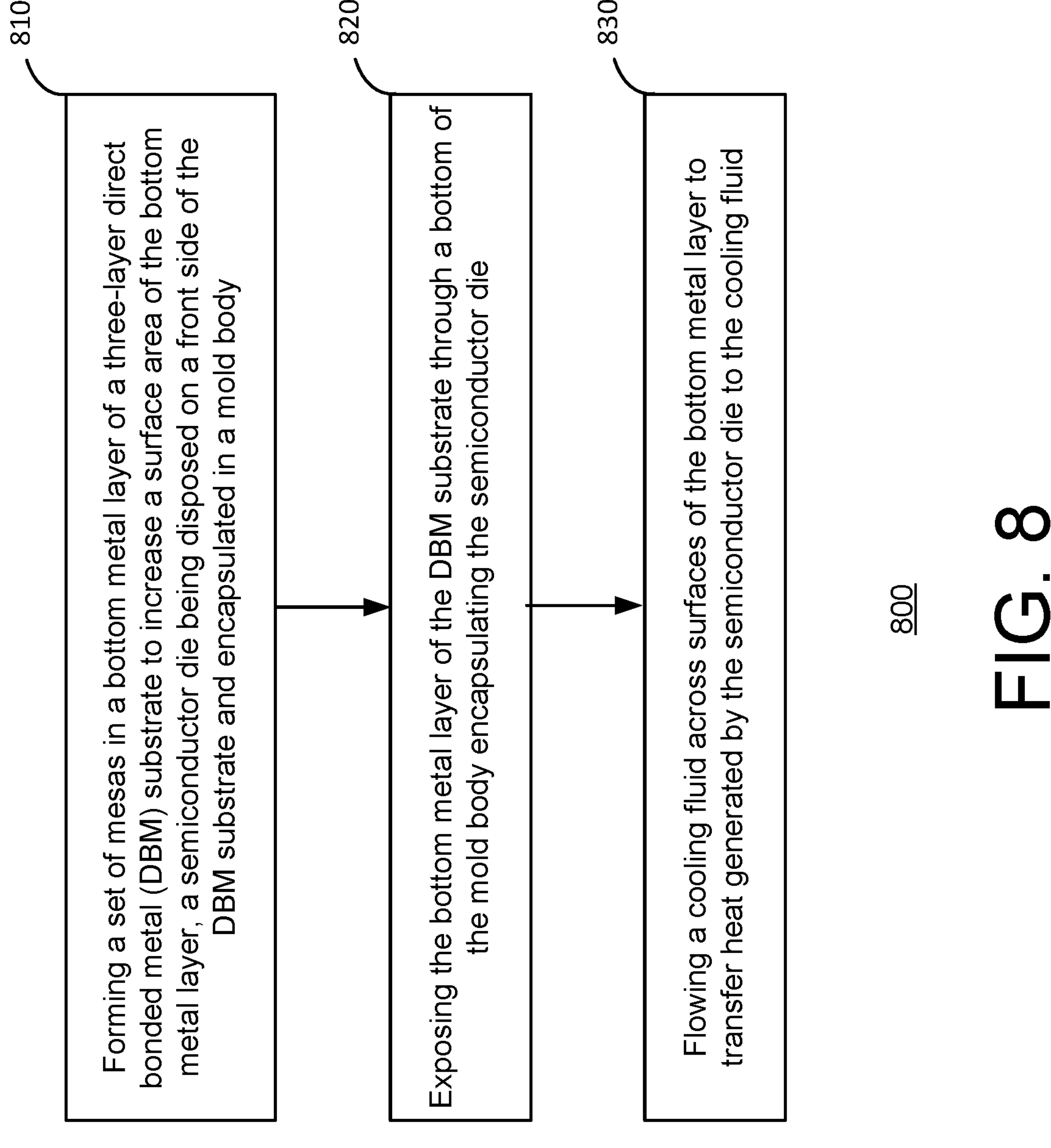
FIG. 8 illustrates an example method for dissipating heat generated by semiconductor die in a semiconductor device package.

FIG. 8 illustrates an example method 800 for dissipating heat generated by semiconductor die in a semiconductor device package. The semiconductor die may be disposed on a three-layer direct bonded metal substrate (DBM) substrate and encapsulated in a mold body.

Method 800 includes forming a set of mesas in a bottom metal layer of a three-layer direct bonded metal (DBM) substrate to increase a surface area of the bottom metal layer (810). A semiconductor die may be disposed on a front side of the DBM substrate and encapsulated in a mold body.

Method 800 further includes exposing the bottom metal layer of the DBM substrate through a bottom of the mold body encapsulating the semiconductor die (820) and flowing a cooling fluid across the bottom metal layer to transfer heat generated by the semiconductor die to the cooling fluid (830).

In example implementations, the bottom metal layer of the three-layer DBM substrate may be copper layer (e.g., a plated copper layer that is at least 1.0 mm thick). Forming a sets of mesas in the bottom metal layer of the three-layer direct bonded metal (DBM) substrate 810 may include forming an array of mesas (pillars) in the bottom metal layer.

Forming the mesas may include etching a first set of parallel grooves and etching a second set of parallel grooves intersecting the first set of grooves in the bottom metal layer. The mesas (e.g., mesa 12) may have a rectangular cross-section (with a width W and a length L), and a top surface at a height h. The grooves may form channels in the bottom metal layer for fluid flow along and in contact with the sides of the mesas.

In example implementations, the array of mesas may include mesas (e.g., mesa 12) arranged in rows and in columns across the bottom metal layer. Mesas in adjacent rows (e.g., row R1 and R2) may be separated by an inter-row distance (e.g., distance IR). Further, adjacent mesas in a specific row may be separated by an inter-columnar distance (e.g., distance IC).

In example implementations, the inter-row distance (e.g., distance IR) may, for example, be between 1.0 mm and 3.0 mm (e.g., about 1.2 mm) and the inter-columnar distance (e.g., distance IC) may, for example, be between 1.0 mm and 3.0 mm (e.g., about 1.2 mm).

The grooves (e.g., groove 11) which define the mesas (e.g., mesa 12) can create a path P for cooling fluid flow along sides of the mesas in the array of mesas. In example implementations, the mesas in a row (e.g., row R1 in the x direction) may be offset from corresponding mesas in the next row (e.g., row R2) by an offset distance (e.g., distance OD) (e.g., in the x direction). In example implementations, the offset distance (e.g., distance OD) for example, be between 1.0 mm and 3.0 mm (e.g., about 1.3 mm). This offset of the mesas in a row and the next row may result (as shown in FIG. 5B) in a zig-zag path (e.g., path P) along and around the sides of mesas in the array of mesas for cooling fluid flow. Forming a sets of mesas in the bottom metal layer of the three-layer direct bonded metal (DBM) substrate 810 may include creating a zig-zag path around the sides of mesas for cooling fluid flow.

Forming a sets of mesas in the bottom metal layer of the three-layer direct bonded metal (DBM) substrate 810 may further include attaching a strip to the top surfaces of the mesas in a row. The strip may, for example, be a conductive strip (e.g., conductive strip 13). The strip may, for example, have a width that is the same as, or about the same as, a length L (in the y direction, FIG. 5B) of the mesas in the row (in other words, a ribbon width that is the same as, or about the same as, a length of the mesas perpendicular to a direction of the row). The conductive strip may, for example, be a corrugated strip including coupling portions (e.g., coupling portion 13*a*) and bridging portions (e.g., bridging portion 13*b*). Attaching the strip to the top surfaces of the mesas in a row may include aligning and bonding the coupling portions of the strip to the top surfaces T of the mesas (e.g., mesa 12). The bridging portions 13*b* between adjacent coupling portions 13*a* may have a wavy shape (e.g., a half-cylinder shape) extending over the groove between adjacent mesas in the row.

In method 800, exposing the bottom metal layer of the DBM substrate through a bottom of the mold body encapsulating the semiconductor die 820 may further include attaching a cooling jacket the bottom of the mold body to enclose the bottom metal layer. Further, flowing the cooling fluid across the bottom metal layer may include flowing the cooling fluid in the cooling jacket to pass through paths along and around the sides of mesas in the array of mesas in the bottom metal layer. Flowing the cooling fluid across the bottom metal layer may also include flowing the cooling fluid above and below the conductive strip attached to the top surfaces of the mesas in the row.

In example implementations, the method for heat removal may include flowing cooling fluid through the cooling jacket to pass through paths along and around the sides of mesas in the array of mesas in the bottom metal layer.

In example implementations, the conductive strip (e.g., a metal ribbon) may be made of a metal or a metal alloy (e.g., copper, aluminum, or alloy).

The various implementations described herein are given only by way of example and only for purposes of illustration. It will understood, for purposes of this disclosure, that when an element, such as a layer, a region, a component, or a substrate, is referred to as being on, mechanically connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification and or shown in the figures.

As used in this specification, a singular form may, unless indicating a particular case in the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method, comprising:

forming an array of mesas in a bottom metal layer of a three-layer direct bonded metal (DBM) substrate to increase a surface area of the bottom metal layer, the array of mesas including a plurality of rows of mesas;

attaching at least one strip of a plurality of strips to a corresponding one of the plurality of rows of mesas, wherein the strip is a corrugated strip including flat coupling portions connected by curved bridging portions, and wherein attaching the strip includes aligning and bonding the flat coupling portions of the strip to the top surfaces of the mesas while the curved bridging portions extend over grooves between adjacent mesas in the row of mesas;

disposing a semiconductor die on a top metal layer of the three-layer DBM substrate; and exposing the bottom metal layer of the three-layer DBM substrate through a bottom of a mold body encapsulating the semiconductor die.

2. The method of claim 1, wherein the bottom metal layer of the three-layer DBM substrate is a copper layer that is at least 1.0 mm thick.

3. The method of claim 1, wherein forming the array of mesas in the bottom metal layer includes etching a first set of parallel grooves and etching a second set of parallel grooves intersecting the first set of parallel grooves in the bottom metal layer.

4. The method of claim 3, wherein the etching includes defining a path for cooling fluid flow through grooves along sides of the mesas in the array of mesas.

5. The method of claim 4, wherein mesas in a first row of mesas are offset from corresponding mesas in an adjacent row of mesas by an offset distance, and wherein the etching includes defining a serpentine path for cooling fluid flow through grooves along and around the sides of mesas in the array of mesas.

6. The method of claim 1, wherein attaching at least one strip of a plurality of strips includes, for each of the plurality of rows of mesas, attaching a strip to top surfaces of the mesas in the row of mesas.

7. The method of claim 6, wherein the strip is made of metal, and has a width that is a same as, or about the same as, a length of the mesas in direction perpendicular to a direction of the row.

8. The method of claim 4, wherein exposing the bottom metal layer of the three-layer DBM substrate through the bottom of the mold body further includes attaching a cooling jacket to the bottom of the mold body to enclose the bottom metal layer.

9. The method of claim 6, wherein the strip is a conductive strip having a thickness in a range of 0.1 mm to 0.4 mm.

10. A method, comprising:
- forming a set of mesas in a bottom metal layer of a substrate, the set of mesas including at least one row of mesas defined by a plurality of parallel grooves extending in a first direction;
- attaching a corrugated strip across the at least one row of mesas, the corrugated strip including a plurality of flat coupling portions and a plurality of curved bridging portions, each curved bridging portion extending over a respective groove between adjacent mesas;
- disposing a semiconductor die on a top metal layer of the substrate; and
- exposing the bottom metal layer of the substrate through a bottom of a mold body encapsulating the semiconductor die.

11. The method of claim 10, wherein attaching a corrugated strip across the at least one row of mesas includes:
- bonding the plurality of flat coupling portions to respective surfaces of the at least one row of mesas.

12. The method of claim 10, wherein the plurality of parallel grooves is a first plurality of parallel grooves, and wherein the at least one row of mesas includes a first row of mesas defined by the first plurality of parallel grooves and a second row of mesas defined by a second plurality of parallel grooves extending in the first direction, the second plurality of parallel grooves being unaligned with the first plurality of parallel grooves.

13. The method of claim 12, wherein the first row of mesas is separated from the second row of mesas by a transverse groove extending in a second direction orthogonal to the first direction.

14. The method of claim 12, wherein the corrugated strip is a first corrugated strip and the plurality of curved bridging portions is a first plurality of curved bridging portions, and wherein attaching a corrugated strip across the at least one row of mesas includes:
- attaching the first corrugated strip across the first row of mesas; and
- attaching a second corrugated strip across the second row of mesas, the second corrugated strip including a plurality of curved bridging portions that are unaligned with the first plurality of curved bridging portions in the first direction.

15. The method of claim 10, wherein mesas in the at least one row of mesas have a length in the first direction, and wherein the corrugated strip has a width in the first direction that is a same as, or about the same as, the length of the mesas.

16. The method of claim 10, wherein exposing the bottom metal layer of the substrate through the bottom of the mold body further includes attaching a cooling jacket to the bottom of the mold body to enclose the bottom metal layer.

17. A method, comprising:
- forming an array of mesas in a bottom metal layer of a substrate, each mesa in the array being separated from an adjacent mesa by a corresponding groove;
- attaching a corrugated strip to at least a first mesa and a second mesa of the array of mesas, the corrugated strip including:
  - a first flat coupling portion coupled to a surface of the first mesa;
  - a second flat coupling portion coupled to a surface of the second mesa; and
  - a curved bridging portion connecting the first flat coupling portion and the second flat coupling portion, the curved bridging portion extending over a groove separating the first mesa and the second mesa, wherein the groove and a surface of the curved bridging portion define a fluid channel; and
- disposing a semiconductor die on a top metal layer of the substrate.

18. The method of claim 17 further comprising:
- exposing the bottom metal layer of the substrate through a bottom of a mold body encapsulating the semiconductor die; and
- attaching a cooling jacket the bottom of the mold body to enclose the bottom metal layer.

19. The method of claim 17, wherein the groove is a first groove and the curved bridging portion is a first curved bridging portion, the corrugated strip including:
- a third flat coupling portion coupled to a surface of a third mesa; and
- a second curved bridging portion connecting the second flat coupling portion and the third flat coupling portion, the second curved bridging portion extending over a second groove separating the second mesa and the third mesa.

20. The method of claim 19, wherein the fluid channel is a first fluid channel, and wherein the second groove and a surface of the second curved bridging portion define a second fluid channel.

21. The method of claim 17, wherein the mesas have a length in a first direction, and wherein the corrugated strip has a width in the first direction that is a same as, or about the same as, the length of the mesas.

22. The method of claim 17, wherein a mesa in the array of mesas has a rectangular or square cross section with a width in a range of 2.0 mm to 4.0 mm and a length in a range of a range of 2.0 mm to 4.0 mm.

* * * * *